US009519229B2

(12) United States Patent
Margeson (10) Patent No.: US 9,519,229 B2
(45) Date of Patent: Dec. 13, 2016

(54) APPARATUS AND METHODS FOR INHIBITING IMMERSION LIQUID FROM FLOWING BELOW A SUSTRATE

(75) Inventor: Christopher Margeson, Mountain View, CA (US)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 13/067,569

(22) Filed: Jun. 9, 2011

(65) Prior Publication Data

US 2011/0242511 A1 Oct. 6, 2011

Related U.S. Application Data

(62) Division of application No. 11/802,731, filed on May 24, 2007, now abandoned.

(60) Provisional application No. 60/808,408, filed on May 25, 2006.

(51) Int. Cl.
*G03F 7/20* (2006.01)

(52) U.S. Cl.
CPC ....... *G03F 7/70716* (2013.01); *G03F 7/70341* (2013.01)

(58) Field of Classification Search
CPC .................. G03F 7/70716; G03F 7/70341
USPC ......................... 355/30, 72–74, 53
See application file for complete search history.

(56) References Cited

U.S. PATENT DOCUMENTS

| 5,668,672 | A | 9/1997 | Oomura |
| 5,689,377 | A | 11/1997 | Takahashi |
| 5,835,275 | A | 11/1998 | Takahashi et al. |
| 7,388,649 | B2 | 6/2008 | Kobayashi et al. |
| 2004/0160582 | A1 | 8/2004 | Lof et al. |
| 2005/0219488 | A1 | 10/2005 | Nei et al. |
| 2005/0231694 | A1 | 10/2005 | Kolesnychenko et al. |
| 2006/0023181 | A1 | 2/2006 | Novak |
| 2006/0038968 | A1 | 2/2006 | Kemper et al. |
| 2006/0139614 | A1 | 6/2006 | Owa et al. |
| 2006/0152696 | A1 | 7/2006 | Boogaard et al. |
| 2006/0152697 | A1 | 7/2006 | Poon et al. |
| 2007/0046910 | A1 | 3/2007 | Poon et al. |
| 2007/0269294 | A1 | 11/2007 | Nagasaka et al. |

FOREIGN PATENT DOCUMENTS

| EP | 1 571 695 A1 | 9/2005 |
| EP | 1 641 028 A1 | 3/2006 |
| EP | 1 801 850 A1 | 6/2007 |
| JP | A-10-303114 | 11/1998 |
| WO | WO 2004/093160 | * 10/2004 |

(Continued)

*Primary Examiner* — Chia-How Michael Liu
(74) *Attorney, Agent, or Firm* — Oliff PLC (57) ABSTRACT

A substrate stage is provided with an immersion liquid collection member that surrounds at least an alignment feature of the substrate stage used to align the substrate on the stage by engaging alignment structure of the substrate. The collection member is located at least partly below the periphery of the substrate held by the substrate holding member of the substrate stage. The collection member has an uppermost liquid-receiving surface that preferably is spaced below a lowermost surface of the substrate when the substrate is held by the substrate holding member. The collection member collects liquid that flows along the alignment feature so as to prevent that immersion liquid from flowing along the under-surface of the substrate.

31 Claims, 9 Drawing Sheets

(56) References Cited

FOREIGN PATENT DOCUMENTS

| WO | WO 2004/105017 | 12/2004 |
| WO | WO 2004/112108 A1 | 12/2004 |
| WO | WO 2005/024517 | 3/2005 |
| WO | WO 2006/030908 A1 | 3/2006 |

* cited by examiner

APPARATUS AND METHODS FOR INHIBITING IMMERSION LIQUID FROM FLOWING BELOW A SUSTRATE

CROSS-REFERENCE TO RELATED APPLICATION

This is a Division of application Ser. No. 11/802,731 filed May 24, 2007, which claims the benefit of U.S. Provisional Patent Application No. 60/808,408 filed May 25, 2006. The disclosures of the prior applications are incorporated herein by reference in their entirety.

BACKGROUND

The invention relates to immersion lithography apparatus and methods, and particularly to apparatus and methods for inhibiting immersion liquid from flowing (for example, due to wicking) to the under-surface of a substrate that is being exposed on a substrate stage.

A typical lithography apparatus includes a radiation source, a projection optical system and a substrate stage to support and move a substrate to be imaged. A radiation-sensitive material, such as a resist, is coated onto the substrate surface before the substrate is placed on the substrate stage. During operation, radiation energy from the radiation source is used to project an image defined by an imaging element through the projection optical system onto the substrate. The projection optical system typically includes a plurality of lenses. The lens or optical element closest to the substrate can be referred to as the last or final optical element.

The projection area during exposure is typically much smaller than the imaging surface of the substrate. The substrate therefore is moved relative to the projection optical system in order to pattern the entire surface of the substrate. In the semiconductor industry, two types of lithography apparatus are commonly used. With so-called "step-and-repeat" apparatus, the entire image pattern is projected at one moment in a single exposure onto a target area of the substrate. After the exposure, the substrate is moved or "stepped" in the X and/or Y direction(s) and a new target area is exposed. This step-and-repeat process is performed multiple times until the entire substrate surface is exposed. With scanning type lithography apparatus, the target area is exposed in a continuous or "scanning" motion. For example, when the image is projected by transmitting light through a reticle or mask, the reticle or mask is moved in one direction while the substrate is moved in either the same or the opposite direction during exposure of one target area. The substrate is then moved in the X and/or Y direction(s) to the next scanned target area. The process is repeated until all of the desired target areas on the substrate have been exposed.

Lithography apparatus are typically used to image or pattern semiconductor wafers and flat panel displays. The word "substrate" as used herein is intended to generically mean any work piece that can be patterned including, but not limited to, semiconductor wafers and flat panel displays.

Immersion lithography is a technique that can enhance the resolution of lithography exposure apparatus by permitting exposure to take place with a numerical aperture (NA) that is greater than the NA that can be achieved in conventional "dry" lithography exposure apparatus. By filling the space between the final optical element of the projection system and the resist-coated substrate, immersion lithography permits exposure with light that would otherwise be internally reflected at the optic-air interface. Numerical apertures as high as the index of the immersion fluid (or of the resist or lens material, whichever is least) are possible in immersion lithography systems. Liquid immersion also increases the substrate depth-of-focus, that is, the tolerable error in the vertical position of the substrate, by the index of the immersion fluid compared to a dry system having the same numerical aperture. Immersion lithography thus can provide resolution enhancement equivalent to a shift from 248 nm to 193 nm without actually decreasing the exposure light wavelength. Thus, unlike a shift in the exposure light wavelength, the use of immersion would not require the development of new light sources, optical materials (for the illumination and projection systems) or coatings, and can allow the use of the same or similar resists as conventional "dry" lithography at the same wavelength. In an immersion system in which only the final optical element of the projection system and its housing and the substrate (and perhaps portions of the stage as well) are in contact with the immersion fluid, much of the technology and design developed for dry lithography can carry over directly to immersion lithography.

However, because the substrate moves rapidly in a typical lithography system, the immersion fluid in the immersion area between the projection system and the substrate tends to be carried away from the immersion area. If the immersion fluid escapes from the immersion area, that fluid can interfere with operation of other components of the lithography system. One way to recover the immersion fluid and prevent the immersion fluid from contaminating the immersion lithography system is described in US2006/0152697 A1, the disclosure of which is incorporated herein by reference in its entirety. US2006/0152697 A1 discloses an immersion fluid supply and recovery system in which a porous member surrounds the immersion area and is in fluid communication with the space that defines the immersion area. The porous member is maintained at a pressure that is under the bubble point of the porous member, such that immersion fluid that escapes from the immersion area is captured (recovered) by the porous member. The porous member encircles the immersion area and is maintained at a substantially constant low pressure.

Another problem that exists in immersion lithography apparatus is the undesired flow of the immersion liquid to the under-surface of the substrate that is being exposed. Immersion liquid that was not recovered from the substrate can move to the edge of the substrate, for example, due to movement of the substrate by the substrate stage, and then flow to the under-surface of the substrate. Moreover, even with systems in which a localized area is provided with immersion liquid, such as the systems described in the above-identified US2006/0152697A1, the localized immersion area extends beyond the periphery of the substrate when exposure takes place near the edge of the substrate. It is known to make the portion of the substrate stage surrounding the periphery of the substrate substantially flush with the upper surface of the substrate and to dispose the surrounding stage portion very close to the substrate periphery in order to inhibit the flow of immersion liquid over the substrate periphery and to the under-surface of the substrate. However, it is not uncommon for some immersion liquid to flow or wick (that is move by capillary action) through the small gap between the substrate periphery and the surrounding portion of the substrate stage, and thus wet the under-surface of the substrate.

It is undesirable to wet the under-surface of the substrate because that may cause the substrate to stick to the substrate holding member, making it difficult to remove the substrate from the substrate holding member when exposure is completed. Additionally, immersion liquid that flows to the under-surface of the substrate can enter the vacuum passages that are used to hold the substrate to the substrate holding member, which is not desirable. Other undesirable effects of the liquid not being directed away from the substrate or its moving assembly include liquid damage to motors that move the substrate, and liquid interfering with substrate stage position sensors, which could cause a system crash.

SUMMARY

Substrate stages typically include some type of alignment structure that engages a corresponding alignment feature on the substrate so as to orient the substrate on the substrate holding member of the substrate stage. For example, a substrate typically will have one or more V-shaped notches in the substrate periphery, and the substrate stage will include one or more corresponding alignment pins that engage the V-shaped notch so as to orient the substrate in a fixed position on the substrate holding member. A substrate can have a single notch on one section of its periphery and a flat portion on the diametrically opposite portion of the substrate periphery so as to orient the substrate. It also is possible to provide two or more notches at 90° intervals, for example, along the substrate periphery. The alignment pin(s) provides a high-risk area for the flow of immersion liquid to the under-surface of the substrate.

Even in arrangements where the alignment pin(s) engage(s) a portion of a substrate periphery that does not have a notch (for example, it is possible for the pin(s) to engage a flat formed on the substrate periphery or to engage the curved portion of the substrate periphery), the location of alignment pin engagement can be subject to liquid leakage to the undersurface of the substrate.

Furthermore, sometimes, the substrate chuck will have a small gap around the edge of the substrate to prevent bending of the substrate (due to a vacuum holding the substrate to the chuck). Liquid can easily access to the underside of the substrate and the chuck depending on its contact angle and wetting characteristics. Thus, the invention is applicable to systems having alignment pins or other alignment features and to systems that have no alignment features.

According to some aspects of the invention, a substrate stage is provided with an immersion liquid collection member that surrounds at least the alignment pin(s). According to preferred embodiments, the collection member is located at least partly below the periphery of the substrate held by the substrate holding member of the substrate stage. The collection member has an uppermost liquid-receiving surface that preferably is spaced below a lowermost surface of the substrate when the substrate is held by the substrate holding member. The collection member collects liquid that flows along the alignment pin so as to prevent that immersion liquid from flowing along the under-surface of the substrate. Providing a space between the uppermost liquid-receiving surface of the collection member and the lowermost surface of the substrate aids in preventing the immersion liquid from flowing along the under-surface of the substrate.

According to some embodiments, the collection member extends around the entire periphery of the substrate.

According to some embodiments, the collection member includes a hydrophilic material that attracts the immersion liquid.

According to some embodiments, the collection member includes a porous member. The porous member communicates with a low pressure source that draws collected immersion liquid from the porous member. For example, the substrate stage may include a recess with the porous member being disposed in the recess. A low-pressure passage communicates the low pressure source with the recess.

According to some embodiments, the collection member includes a first portion and a second portion, with the first portion being located radially inward of the second portion so that the first portion is disposed closer to a center of the substrate holding member than is the second portion. At least a part of the first portion is disposed below the periphery of the substrate, and a surface of the first portion is hydrophobic so as to repel the immersion liquid. This assists in causing the immersion liquid to move from the first portion toward the second portion and away from the under-surface of the substrate.

According to some embodiments, the second portion is a hydrophilic material that attracts the immersion liquid from the first, hydrophobic portion. A low pressure passage may communicate with the hydrophilic material to remove immersion liquid from the hydrophilic material. According to some embodiments, the second portion is tapered so that a distance between a plane containing the substrate and an upper surface of the second portion increases as the upper surface progresses radially away from the substrate holding member. Such an arrangement further assists in moving immersion liquid away from the under-surface of the substrate.

According to some embodiments, the collection member includes a third portion located radially outward of the second portion. The third portion includes a porous member and receives immersion liquid from the first, hydrophobic portion and from the second, hydrophilic portion. The porous member preferably communicates with a low pressure source that draws collected immersion liquid from the porous member.

The first, hydrophobic portion also can be tapered so that the distance between its upper surface and a plane containing the substrate increases as the upper surface progresses radially away from the substrate holding member.

According to some embodiments, the second portion is a porous member (rather than a hydrophilic member) and receives immersion liquid from the first, hydrophobic portion. The porous member communicates with a low pressure source that draws collected immersion liquid from the porous member. The first, hydrophobic portion may be tapered to assist in the flow of immersion liquid to the porous member. Furthermore, according to some embodiments, a third portion can be located radially outward of the second, porous portion. The third portion includes a hydrophilic member so as to attract immersion liquid from the first, hydrophobic portion toward the second and third portions.

According to some aspects of the invention, in which the substrate holding member includes a plurality of protrusions that contact a lower surface of the substrate, the first, hydrophobic portion of the collection member includes at least one protrusion disposed below the substrate periphery and having a height that is less than a height of the substrate holding member protrusions. Each protrusion of the first portion is hydrophobic, thus assisting in preventing immersion liquid from flowing along the under-surface of the substrate.

According to some aspects of the invention, the alignment pin(s) has a hydrophobic surface that repels the immersion liquid.

Other aspects of the invention relate to methods of performing immersion lithography using immersion lithography apparatus according to the various aspects and embodiments of the invention.

As used in this document, "hydrophobic" and "hydrophilic" are meant to encompass the affinity against or for, respectively, various immersion liquids, which could be liquids other than water. Thus, "hydrophobic" is intended to mean "liquid-phobic" and "hydrophilic" is intended to mean "liquid-phillic".

BRIEF DESCRIPTION OF THE DRAWINGS

The invention will be described in conjunction with the following drawings of exemplary embodiments in which like reference numerals designate like elements, and in which.

DETAILED DESCRIPTION OF EMBODIMENTS

Figure 1:
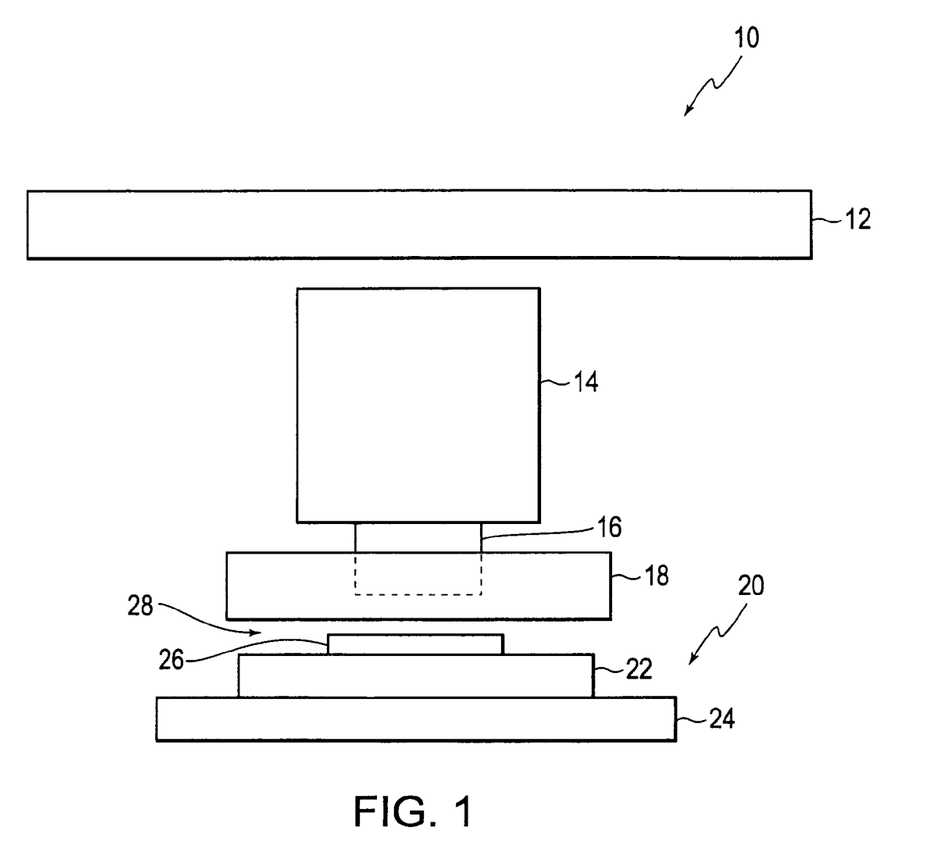
FIG. 1 is a simplified elevational view schematically illustrating an immersion lithography system according to some embodiments of the invention.

FIG. 1 shows an immersion lithography system 10 including a reticle stage 12 on which a reticle is supported, a projection system 14 having a last or "final" optical element 16, and a substrate 26 supported on a fine-movement stage 22, which in turn is movable over a coarse-movement stage 24, which are collectively referred to as substrate stage 20. The substrate 26 is vacuum chucked to the fine-movement stage 22 by use of a pin chuck or substrate chuck. An immersion fluid supply and recovery apparatus 18, which is sometimes referred to herein as an immersion fluid supply and recovery nozzle, is disposed around the final optical element 16 of the projection system 14 so as to provide and recover an immersion fluid, which may be a liquid such as, for example, water, to/from a gap 28 between the final optical element 16 and the substrate 26. In the present embodiment, the immersion lithography system 10 is a scanning lithography system in which the reticle and the substrate 26 are moved synchronously in respective scanning directions during a scanning exposure operation. The fine-movement stage 22 controls the position of the substrate 26 in one or more (preferably all) of the X, Y, Z, θX, θY and θZ directions with a higher degree of precision than the coarse-movement stage 24, which is primarily used for moving the substrate 26 over longer distances, as is well known in the art.

The illumination source of the lithography system can be a light source such as, for example, a mercury g-line source (436 nm) or i-line source (365 nm), a KrF excimer laser (248 nm), an ArF excimer laser (193 nm) or a $F_2$ laser (157 nm). The projection system 14 projects and/or focuses the light passing through the reticle onto the substrate 26. Depending upon the design of the exposure apparatus, the projection system 14 can magnify or reduce the image illuminated on the reticle. It also could be a 1× magnification system.

When far ultraviolet radiation such as from the excimer laser is used, glass materials such as quartz and fluorite that transmit far ultraviolet rays can be used in the projection system 14. The projection system 14 can be a catadioptric, completely refractive or completely reflective.

With an exposure device that employs radiation of wavelength 200 nm or more, use of the catadioptric type optical system can be considered. Examples of the catadioptric type of optical system are shown in U.S. Pat. Nos. 5,668,672 and 5,835,275. In these cases, the reflecting optical device can be a catadioptric optical system incorporating a beam splitter and concave mirror. U.S. Pat. No. 5,689,377 also uses a reflective-refracting type of optical system incorporating a concave mirror, etc., but without a beam splitter, and also can be employed with this invention. The disclosures of the above-mentioned U.S. patents are incorporated herein by reference in their entireties.

The immersion fluid supply and recovery apparatus 18 supplies immersion liquid to a portion of the gap 28 disposed between the last optical element 16 and the upper surface of the substrate 26. The area where the immersion liquid is supplied can be referred to as an immersion area. The immersion area has a size that is smaller than the surface of the substrate 26, and thus can be referred to as a localized area. The immersion fluid supply and recovery apparatus also collects immersion fluid so that the immersion fluid is continuously (or substantially continuously) supplied to and recovered from the immersion area so as to provide a flow of fresh immersion fluid to that area. The immersion fluid is precisely temperature-controlled and filtered so as to remove particles and gas bubbles. Various structures can be provided as the immersion fluid supply and recovery apparatus 18. See, for example, US2005/0219488A1, US2006/0023181 A1 and US2006/0038968A1, the disclosures of which are incorporated herein by reference in their entireties.

Figure 2:
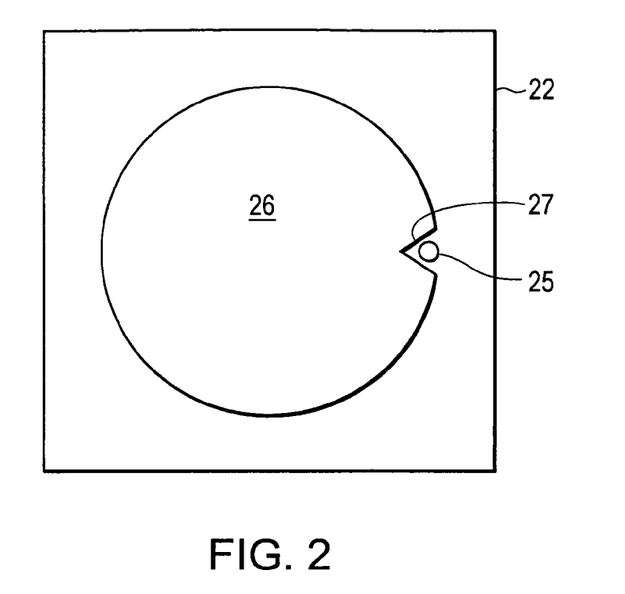
FIG. 2 is a plan view showing a substrate having a V-shaped alignment feature, the substrate being disposed on a substrate stage having an alignment pin that engages the alignment feature.
Figure 3:
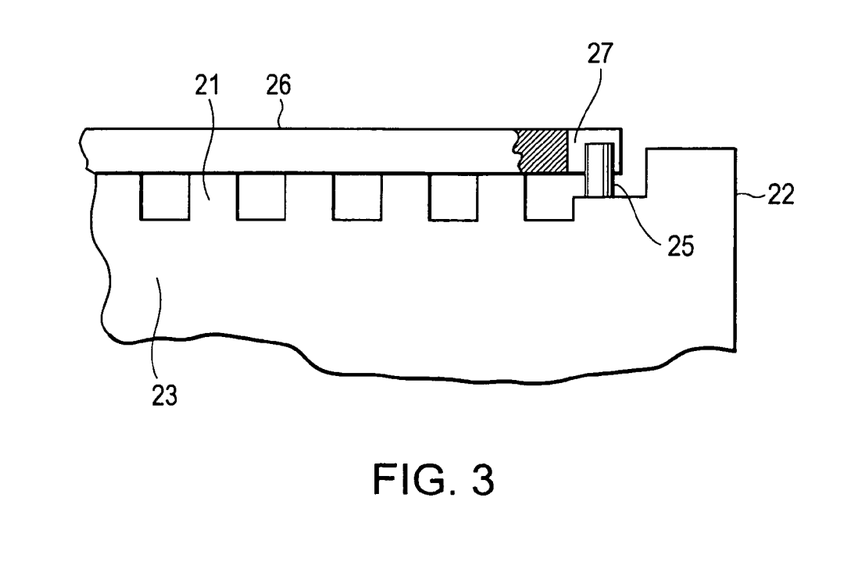
FIG. 3 is a side view of the FIG. 2 arrangement, and shows one manner in which the alignment pin engages the alignment feature of the substrate.

FIGS. 2 and 3 show the fine-movement stage 22 of the substrate stage 20 and show a substrate 26 held by a substrate holding member 23 of the fine-movement stage 22. In addition, a V-shaped notch (alignment feature) 27 provided in the periphery of the substrate 26 is shown engaged with an alignment pin 25 of the stage 22. The alignment notch 27 and alignment pin 25 are shown greatly exaggerated in the drawings. For example, the alignment notch 27 typically extends only a very small amount, if at all, into the periphery of the substrate 26, and is much smaller in size relative to the substrate, than is depicted in the drawings. As shown in FIG. 3, the alignment pin 25 has a height such that it extends above the lower surface of the substrate 26, but typically is not tall enough to extend above the upper surface of the substrate 26. FIG. 3 also shows that the substrate holding member 23 of the stage 22 includes protrusions 21 such as pins, dimples or bumps that have upper surfaces that are precisely formed so as to exist in a plane and that engage the lower surface of the substrate 26. A vacuum is supplied through vacuum passages disposed either in the protrusions (opening through the top surface of the protrusions) or opening into the spaces between the protrusions so as to hold the substrate 26 onto the stage 22 by vacuum absorption. See the above-incorporated US2005/0219488A1 for an example of a substrate holding member in which vacuum is supplied through openings in the upper surfaces of the protrusions 21 (this also is known as a vacuum chuck).

Figure 4:
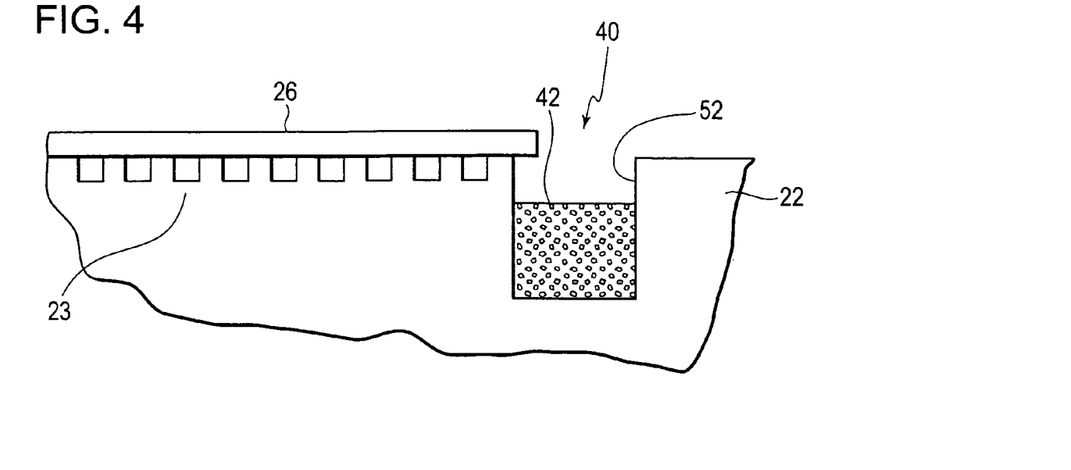
FIG. 4 is a side view showing one embodiment in which a collection member includes a hydrophilic material.

FIG. 4 shows a first embodiment of an immersion liquid collection member 40 that is provided in stage 22 and that is disposed at least partly below the periphery of the substrate 26 held on the substrate holding member 23 of stage 22. The collection member 40 is disposed in a recess 52 that is formed in the stage 22. The recess 52 and the collection member 40 extend partially below the periphery of the substrate 26. In addition, it is preferred that the uppermost, liquid-receiving surface 42 of the collection member 40 is spaced a certain distance below the lowermost surface of the substrate 26. By disposing the collection member 40 below the periphery of the substrate 26, liquid that flows beyond the edge of the substrate will tend to drop onto the collection member 40 rather than flow along the lower surface of the substrate 26, which would be undesirable for the reasons described earlier.

In the FIG. 4 embodiment, the collection member 40 is made from a hydrophilic material. The collection member 40 could be coated with a hydrophilic material to draw liquid away from the substrate edge. The hydrophilic material attracts the immersion liquid that flows beyond the outer periphery of substrate 26. The distance that the collection member extends away from the substrate edge depends on many factors including the stage speed and acceleration, the amount of liquid that typically leaks from the immersion area, etc. If possible, the entire pin-chucking area could be made or coated by a hydrophobic material, with the portion of the collection member near and extending away from the substrate edge being hydrophilic and tapering away from the substrate upper surface. Any suitable material can be used as the hydrophilic material as long as it is more attractive with respect to the immersion liquid than is the substrate 26. Thus, a hydrophilic material can be selected based upon the characteristics of the substrate 26 and based upon the characteristics of the immersion liquid.

Figure 5:
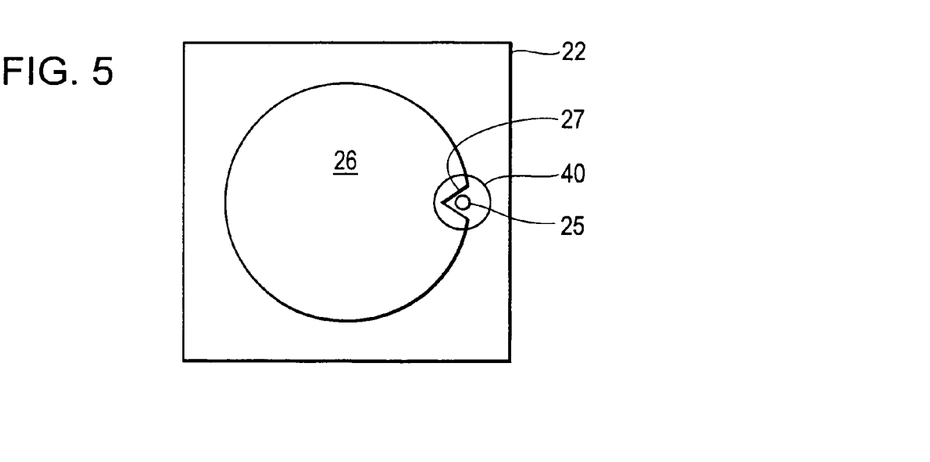
FIG. 5 is a plan view of a substrate stage holding a substrate, and shows a collection member surrounding an alignment pin.
Figure 6:
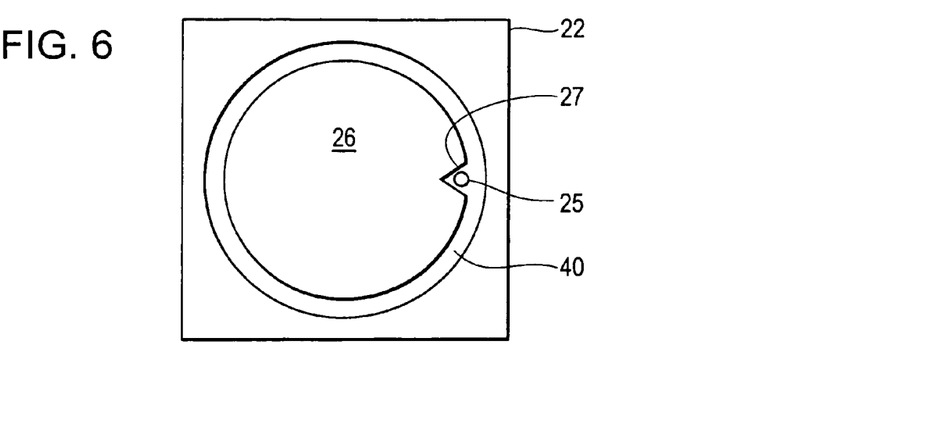
FIG. 6 is a plan view of a substrate stage holding a substrate, and shows a collection member that surrounds the entire periphery of the substrate.

With respect to all embodiments described herein, the collection member 40 can be disposed so as to surround only the alignment pin 25, as shown in FIG. 5, or it could be provided so as to extend around the entire periphery of the substrate 26 as shown in FIG. 6. With respect to the FIG. 6 embodiment, although not shown in FIG. 6, a portion of the collection member 40 also would extend below a small portion of the substrate periphery.

Figure 7:
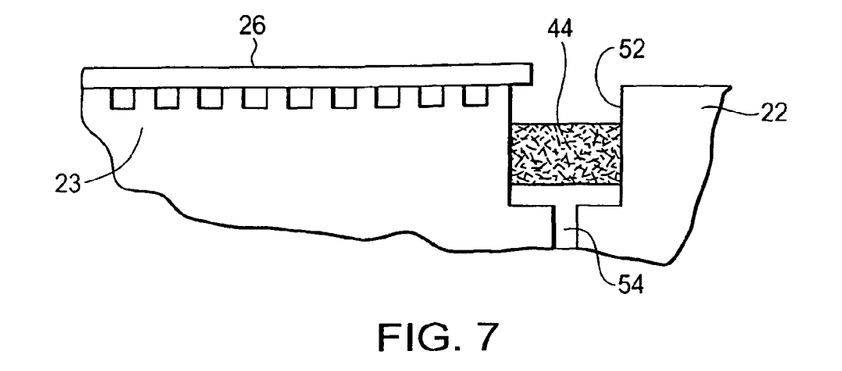
FIG. 7 is a side view showing a collection member that includes a porous member and a low-pressure passage that communicates the porous member with a low pressure source.
Figure 8:
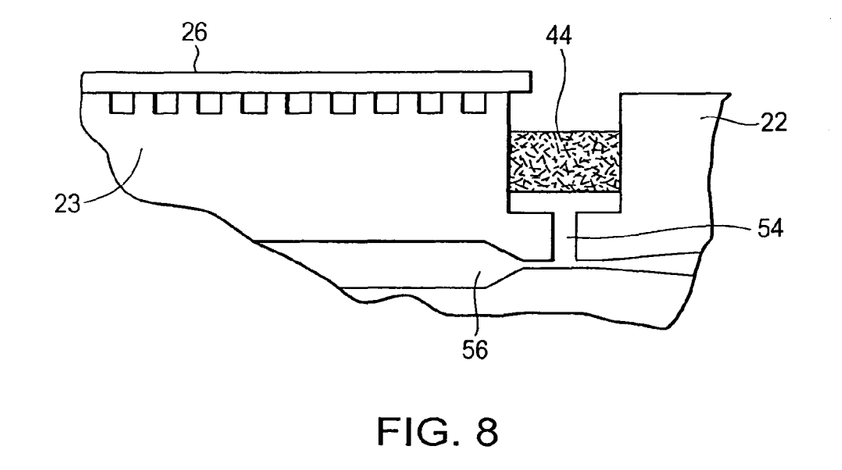
FIG. 8 is a side view of an arrangement similar to FIG. 7 and that also includes structure for providing the low pressure using a venturi.

Various other arrangements can be provided for the collection member 40. FIGS. 7 and 8 show arrangements in which a porous member 44 is used as the collection member. The porous member 44 has a pore size distribution that facilitates bubble point characteristics to attract the immersion liquid.

With respect to FIG. 7, porous member 44 is disposed in a recess 52 similar to the recess of FIG. 4. However, a low pressure passage 54 communicates with the recess and also communicates with a low pressure source so as to draw immersion liquid through the porous member 44. The porous member 44 can be a mesh, a porous material such as a member having holes etched therein. The member can be, for example, glass, metal, ceramics or any material that does not outgas. See, for example, US2007/0046910A1, the disclosure of which is incorporated herein by reference in its entirety. The porous member can be formed by a vacant or hollow volume having a metal screen or mesh sheet at the surface in contact with the liquid. A vacuum or low pressure would be supplied to the vacant volume. As disclosed in US2007/0046910A1, it is desirable that the pressure at a surface of the porous member is below a bubble point of the porous member so that gas bubbles are not entrained through the porous member, which could cause undesirable vibration. The bubble point depends upon the structure of the porous member including the size of its pores, the material and coating of the porous member and the properties of the immersion fluid. The pore size can be, for example, about 25 μm to about 75 μm, and depends on the type of immersion liquid, the vacuum amount and the amount of immersion liquid that will tend to flow through the porous member 44 during a given period of time. Structures for controlling the low pressure supplied through low pressure passage 54 can be those systems described, for example, in US2006/0152696A1 or as described in US2005/0219488, the disclosures of which are incorporated herein by reference in their entireties.

As shown in FIG. 8, a venturi structure 56 can be provided so that when gas flows through the venturi structure 56, it causes a low pressure that is provided to passage 54 so as to draw the collected immersion liquid through the porous member 44. One disadvantage of this structure is that the venturi can generate vibration and noise.

Figure 9:
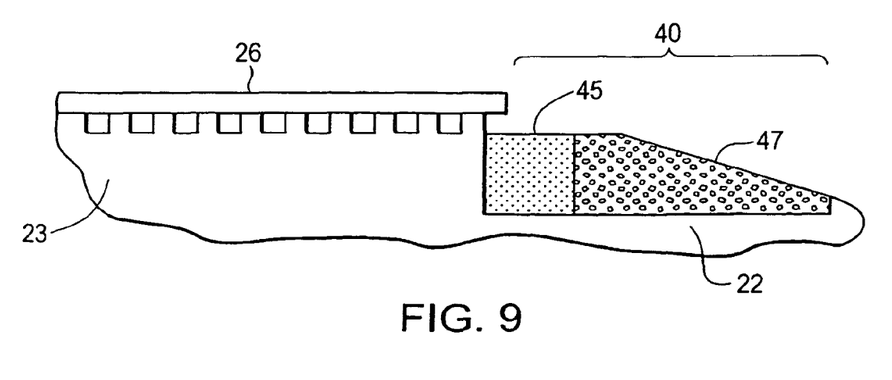
FIG. 9 is a side view of a collection member having first and second portions in which the first portion is hydrophobic and the second portion is hydrophilic.

FIG. 9 shows another embodiment in which the collection member 40 has a first portion 45 and a second portion 47. In FIG. 9, the first portion 45 has a hydrophobic surface, and the second portion 47 is hydrophilic. The first portion 45 extends partially below the periphery of the substrate 26. The second portion 47 is tapered so that a distance between its upper surface and a plane in which the substrate 26 is contained gradually increases as the upper surface of hydrophilic second portion 47 becomes more radially distant from the substrate 26.

The hydrophobic surface of first portion 45 can be any material that is more liquid repellant than the substrate 26. As discussed above with respect to hydrophilic materials, the hydrophilic material of second portion 47 can be any material that is more liquid attractive with respect to the immersion liquid than is the substrate 26. Polytetrafluoroethylene (PTFE) is one material that is hydrophobic with respect to some liquids such as water. In general, hydrophobic materials have a higher contact angle with the liquid than do hydrophilic materials, which have a lower contact angle with the liquid. See US2006/0023181A1 regarding hydrophobic and hydrophilic surfaces. The disclosure of US2006/0023181A1 is incorporated herein by reference in its entirety.

Figure 10:
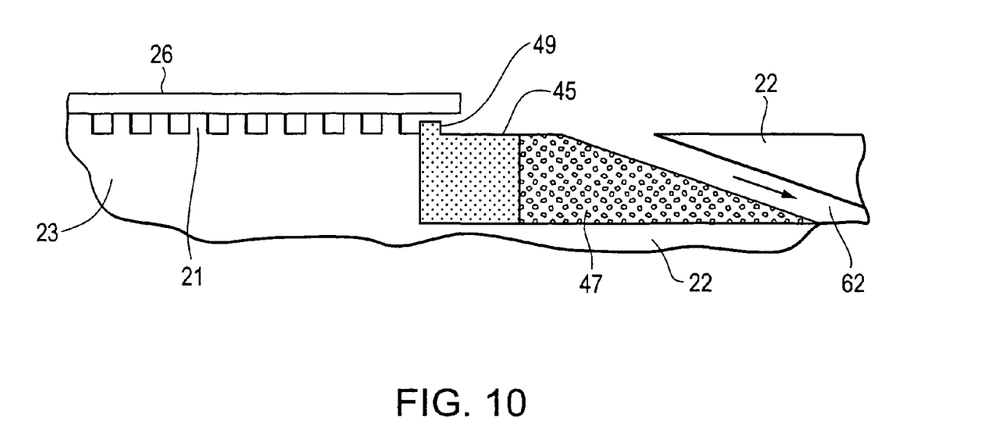
FIG. 10 shows an arrangement similar to FIG. 9 and that also includes a low pressure, such as a vacuum, passage for removing liquid from the hydrophilic portion, and further includes a protrusion of the hydrophobic portion that is disposed under the periphery of the substrate.

FIG. 10 shows an embodiment similar to the FIG. 9 embodiment except that: (i) a low pressure passage 62 is provided in stage 22 so as to remove collected immersion liquid from the hydrophilic portion 47, and (ii) a protrusion 49 is provided in the hydrophobic, first portion 45 of the collection member. As described previously, the substrate holding member 23 includes a plurality of protrusions 21 that have upper surfaces that lie in a common plane so as to contact the lower surface of the substrate 26. The protrusion 49 on the hydrophobic portion 45 has a height slightly less than the height of the protrusions 21 so that the upper surface of protrusion 49 does not contact the lower surface of substrate 26. This reduces the stress on the periphery of substrate 26. Moreover, by making protrusion 49 hydrophobic, it inhibits immersion liquid from flowing (for example, by capillary action) along the lower surface of substrate 26. Although only one protrusion 49 is shown in FIG. 10, there typically would be a plurality of protrusions 49 that are disposed along the outer periphery of the substrate 26 to the extent that the hydrophobic portion 45 also extends along that substrate periphery.

Figure 11:
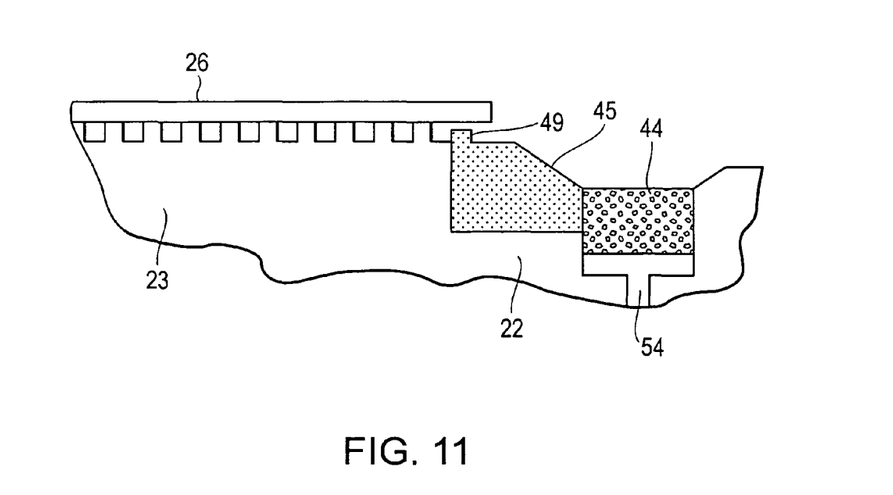
FIG. 11 show an arrangement in which the first portion of the collection member is a tapered hydrophobic portion having a protrusion, and the second portion of the collection member is a porous member supplied with a low pressure.

FIG. 11 shows an arrangement in which the second portion of the collection member is formed by a porous member 44 similar to what was described with respect to FIG. 7. A low pressure passage 54 is provided for the porous member 44. In addition, the first, hydrophobic portion 45 has one or more protrusions 49 and has an upper surface that is tapered as shown in FIG. 11.

Figure 12:
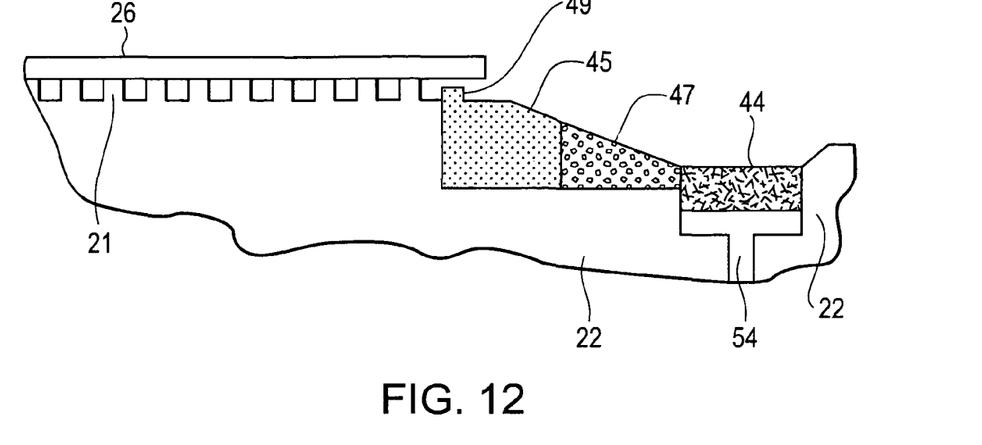
FIG. 12 is a side view of a collection member having a first, hydrophobic portion, a second, hydrophilic portion and a third, porous portion supplied with a low pressure.

FIG. 12 shows another embodiment that is somewhat similar to the FIG. 11 embodiment except that a tapered hydrophilic portion 47 is disposed between the first, hydrophobic portion 45 and the porous member 44. In the FIG. 12 embodiment, a first portion of the collection member is defined by the hydrophobic portion 45, a second portion of the collection member is defined by the hydrophilic portion 47, and a third portion of the collection member is defined by the porous member 44.

Figure 13:
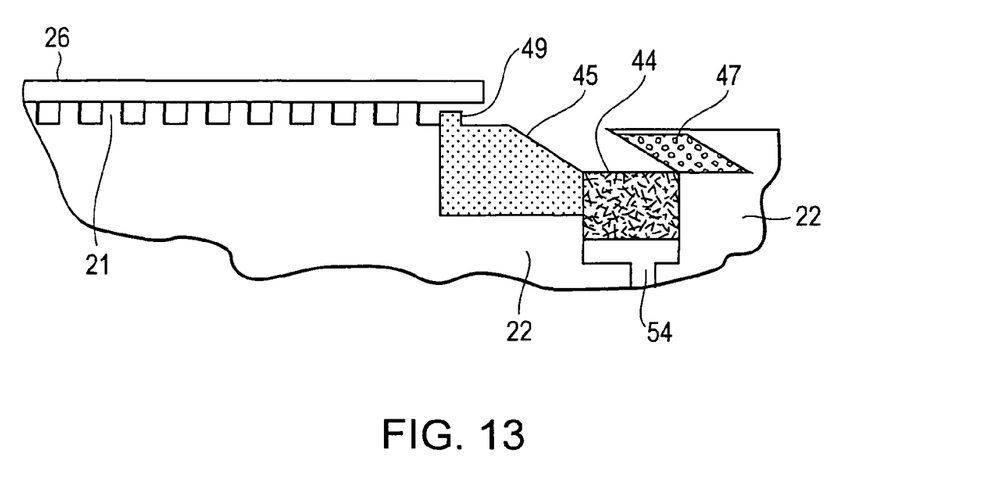
FIG. 13 shows an embodiment in which the collection member includes a first, hydrophobic portion, a second, porous portion supplied with a low pressure, and a third, hydrophilic portion that attracts liquid from the first portion.

FIG. 13 shows another embodiment that is similar to the FIG. 11 embodiment except that a third, hydrophilic portion 47 is provided for the collection member. In the FIG. 13 embodiment, the hydrophilic portion 47 attracts immersion liquid from the first, hydrophobic portion 45 so that the immersion liquid more readily moves to the porous member 44 where it is removed by low pressure passage 54.

Figure 14:
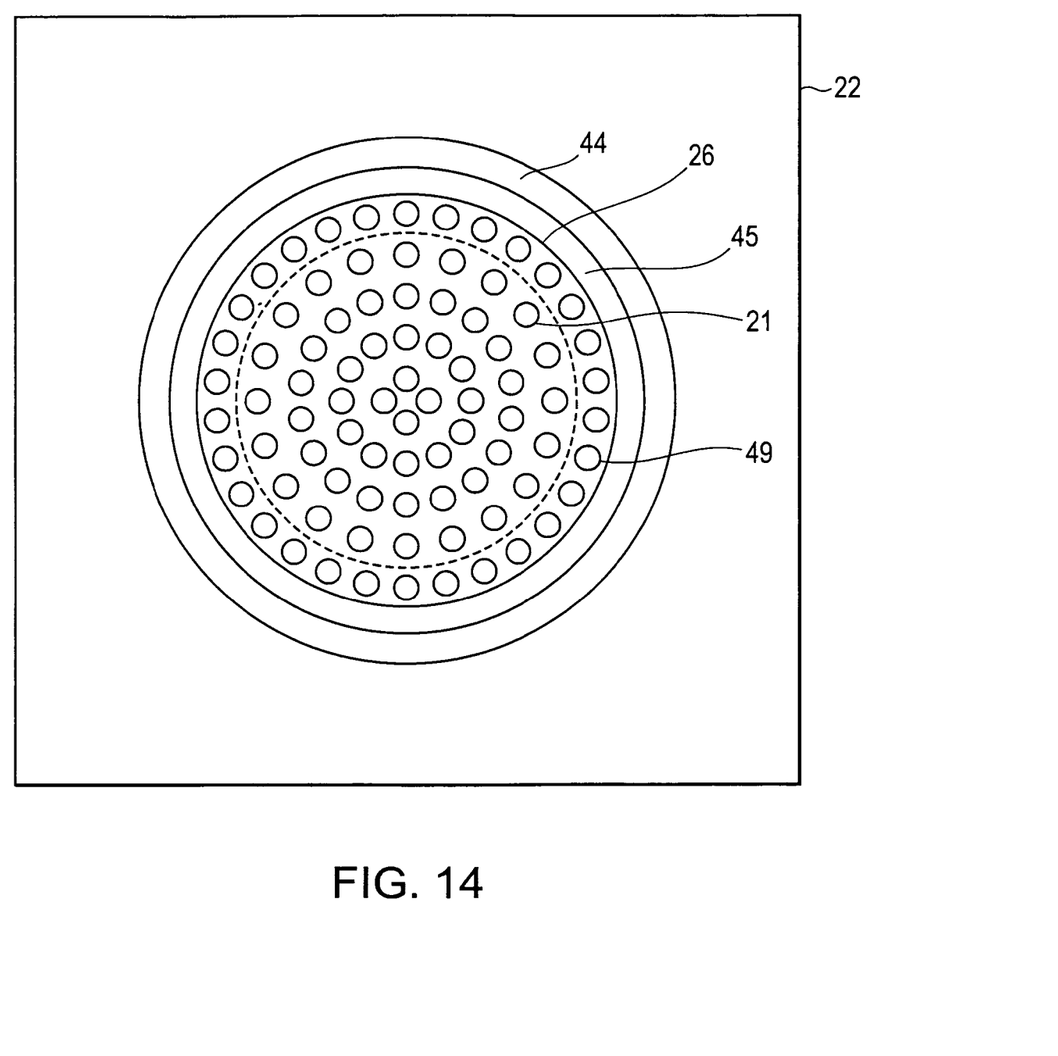
FIG. 14 shows an arrangement in which the collection member surrounds the entire periphery of the substrate and includes first and second portions, with the first portion being hydrophobic, partially underlying the substrate periphery and having protrusions on the portion that underlies the substrate periphery.

FIG. 14 is a plan view showing an arrangement in which the collection member 40 surrounds the entire periphery of substrate 26 and includes a first, radially inner hydrophobic portion 45 with a plurality of protrusions 49 that also are hydrophobic and are similar in structure to what is shown in FIGS. 10-13: The second portion of the collection member is a porous member 44, although any of the arrangements shown in FIGS. 9-13 could be provided in the FIG. 14 embodiment.

In certain embodiments, the immersion fluid is a liquid having a high index of refraction. In different embodiments, the liquid may be pure water, or a liquid including cedar oil, fluorin-based oils, "Decalin" or "Perhydropyrene."

The use of the exposure apparatus described herein is not limited to a photolithography system for semiconductor manufacturing. The exposure apparatus, for example, can be used as an LCD photolithography system that exposes a liquid crystal display device pattern onto a rectangular glass plate, or a photolithography system for manufacturing a thin film magnetic head.

Figure 15A:
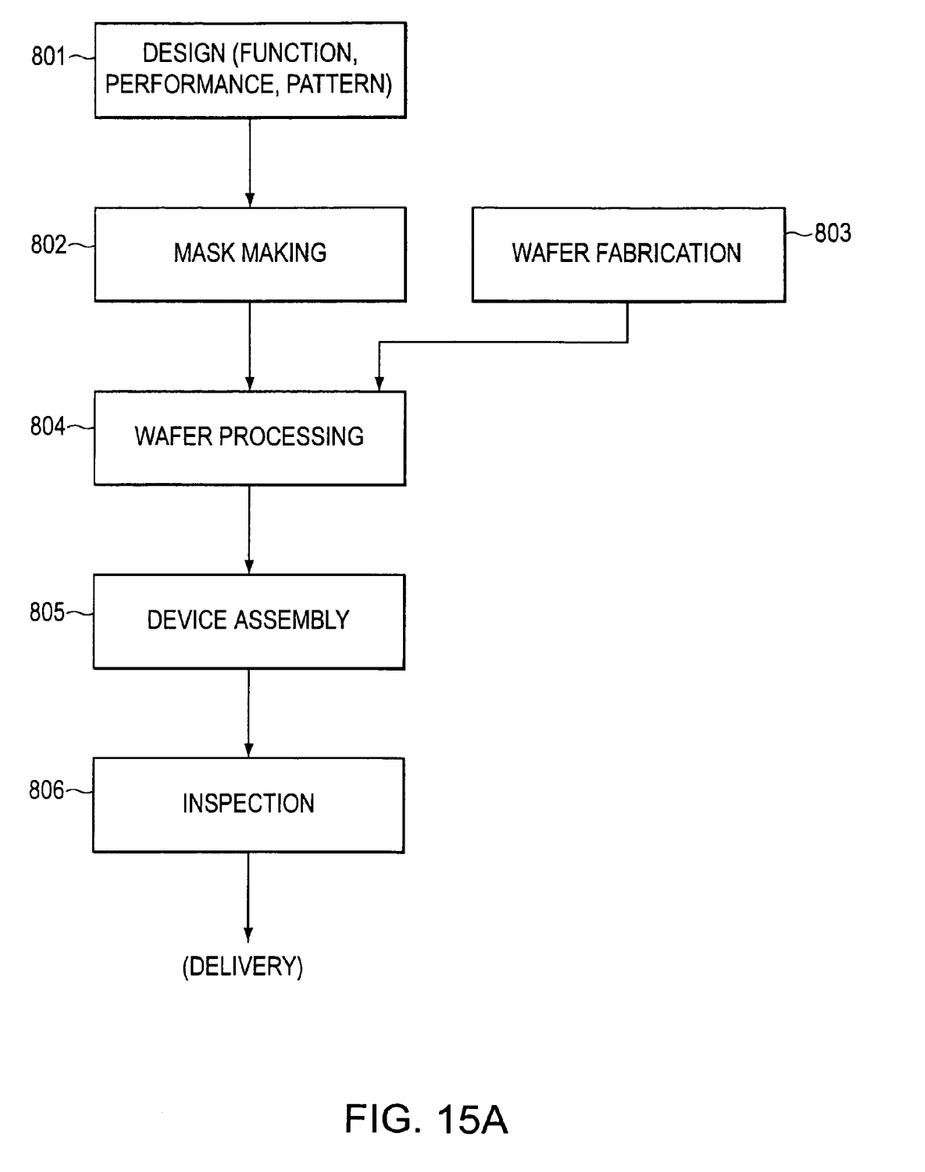
FIG. 15A is a flowchart that outlines a process for manufacturing a device in accordance with the invention.

Semiconductor devices can be fabricated using the above described systems, by the process shown generally in FIG. 15A. In step 801 the device's function and performance characteristics are designed. Next, in step 802, a mask (reticle) having a pattern is designed according to the previous designing step, and in a step 803, a wafer is made from a silicon material. The mask pattern designed in step 802 is exposed onto the wafer from step 803 in step 804 by a photolithography system described hereinabove in accordance with aspects of the invention. In step 805, the semiconductor device is assembled (including the dicing process, bonding process and packaging process). Finally, the device is then inspected in step 806.

Figure 15B:
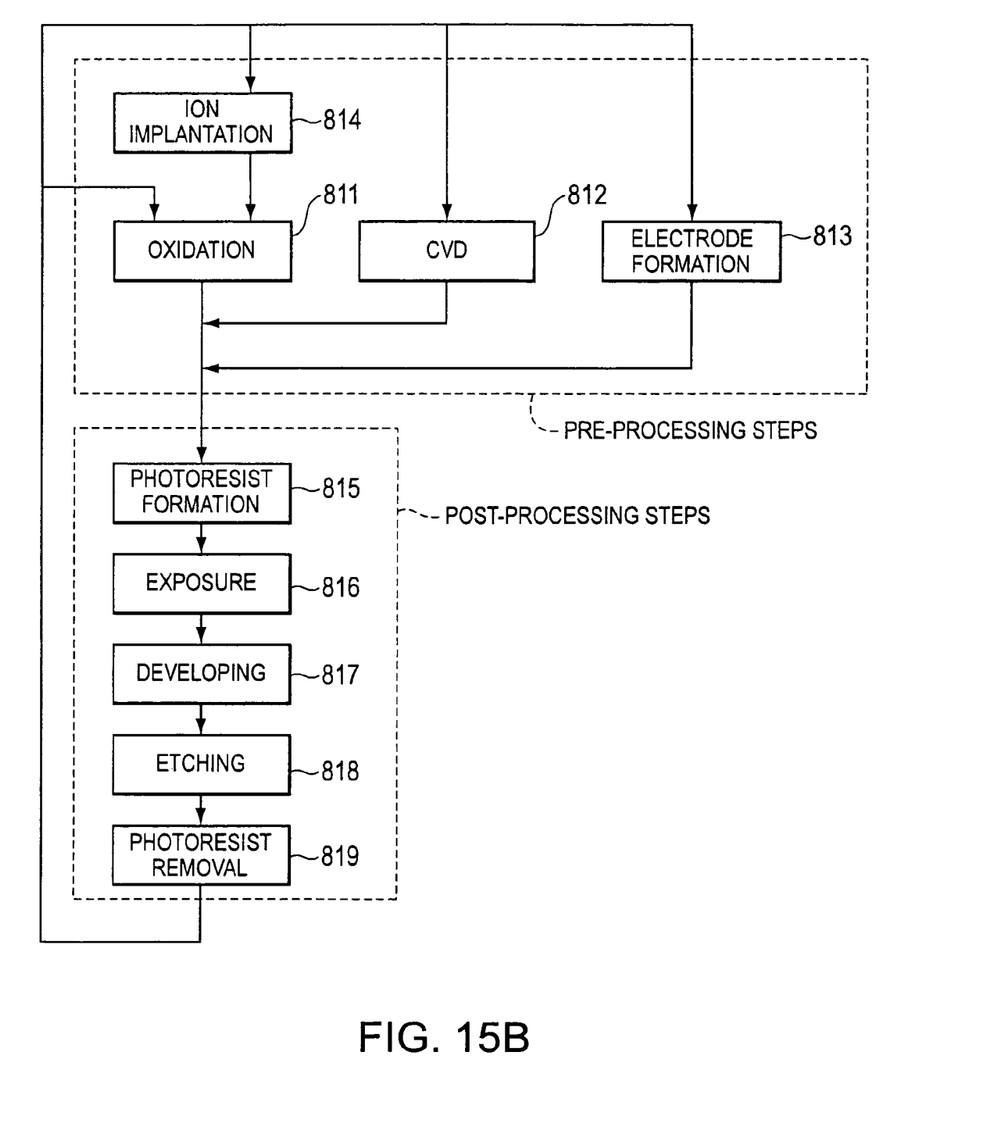
FIG. 15B is a flowchart that outlines device processing in more detail.

FIG. 15B illustrates a detailed flowchart example of the above-mentioned step 804 in the case of fabricating semiconductor devices. In FIG. 15B, in step 811 (oxidation step), the wafer surface is oxidized. In step 812 (CVD step), an insulation film is formed on the wafer surface. In step 813 (electrode formation step), electrodes are formed on the wafer by vapor deposition. In step 814 (ion implantation step), ions are implanted in the wafer. The above mentioned steps 811-814 form the preprocessing steps for wafers during wafer processing, and selection is made at each step according to processing requirements.

At each stage of wafer processing, when the above-mentioned preprocessing steps have been completed, the following post-processing steps are implemented. During post-processing, first, in step 815 (photoresist formation step), photoresist is applied to a wafer. Next, in step 816 (exposure step), the above-mentioned exposure device is used to transfer the circuit pattern of a mask (reticle) to a wafer. Then in step 817 (developing step), the exposed wafer is developed, and in step 818 (etching step), parts other than residual photoresist (exposed material surface) are removed by etching. In step 819 (photoresist removal step), unnecessary photoresist remaining after etching is removed. Multiple circuit patterns are formed by repetition of these preprocessing and post-processing steps.

A photolithography system (an exposure apparatus) according to the embodiments described herein can be built by assembling various subsystems in such a manner that prescribed mechanical accuracy, electrical accuracy, and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes providing mechanical interfaces, electrical circuit wiring connections and air pressure plumbing connections between each subsystem. Each subsystem also is assembled prior to assembling a photolithography system from the various subsystems. Once a photolithography system is assembled using the various subsystems, a total adjustment is performed to make sure that accuracy is maintained in the complete photolithography system. Additionally, it is desirable to manufacture an exposure system in a clean room where the temperature and cleanliness are controlled.

While the invention has been described with reference to preferred embodiments thereof, it is to be understood that the invention is not limited to the preferred embodiments or constructions. The invention is intended to cover various modifications and equivalent arrangements. In addition, while the various elements of the preferred embodiments are shown in various combinations and configurations, that are exemplary, other combinations and configurations, including more, less or only a single element, are also within the spirit and scope of the invention.

What is claimed is:

1. A lithographic exposure apparatus that exposes a substrate by forming an image of a pattern through an immersion liquid onto the substrate, the lithographic exposure apparatus comprising:
a projection optical system that projects the image of the pattern onto the substrate; and
a substrate stage that includes a substrate holding member that holds the substrate adjacent to a last optical element of the projection optical system with a gap between the last optical element and a surface of the substrate onto which the image of the pattern is projected, the immersion liquid at least partially filling the gap,
the substrate stage including an immersion liquid collection member disposed so as to be located at least partly below the outer periphery of the substrate held by the substrate holding member, the collection member having an uppermost liquid-receiving surface that is spaced below a lowermost surface of the substrate held by the substrate holding member,
wherein the collection member includes a first portion and a second portion, the first portion is located radially inward of the second portion so that the first portion is disposed closer to a center of the substrate holding member than is the second portion, a surface of the first portion is hydrophobic so as to repel the immersion liquid to assist in causing the immersion liquid to move from the first portion toward the second portion, at least a part of the hydrophobic surface of the first portion is disposed directly under the outer periphery of the substrate held by the substrate holding member, the portion includes a hydroplhilic surface, the hydrophobic surface and the hydrophilic surface are disposed so that the hydrophobic surface and at least a part of the hydrophilic surface of the second portion are parallel to the substrate held by the substrate holding member.

2. The apparatus of claim 1, wherein the second portion is a hydrophilic member that attracts the immersion liquid from the first portion.

3. The apparatus of claim 2, further comprising a low-pressure passage communicating with the hydrophilic member to remove the immersion liquid from the hydrophilic member.

4. The apparatus of claim 3, wherein a part of the second portion is tapered so that a distance between a plane containing the substrate held by the substrate holding member and an upper surface of the second portion increases as the upper surface progresses radially away from the substrate holding member.

5. The apparatus of claim 1, wherein a part of the second portion is tapered so that a distance between a plane containing the substrate held by the substrate holding member and an upper surface of the second portion increases as the upper surface progresses radially away from the substrate holding member.

6. The apparatus of claim 1, wherein the second portion is a porous member and receives the immersion liquid from the first portion, the porous member communicates with a low pressure source that draws the collected immersion liquid from the porous member.

7. The apparatus of claim 6, wherein at least part of the first portion is tapered so that a distance between a plane containing the substrate and an upper surface of the first portion increases as the upper surface progresses radially away from the substrate holding member.

8. The apparatus of claim 7, wherein the collection member includes a third portion located radially outward of the second portion, the third portion is a hydrophilic member so as to attract the immersion liquid from the first portion toward the second and third portions.

9. The apparatus of claim 6, wherein the collection member includes a third portion located radially outward of the second portion, the third portion is a hydrophilic member so as to attract the immersion liquid from the first portion toward the second and third portions.

10. The apparatus of claim 1, wherein:
the substrate holding member includes a plurality of protrusions that contact a lower surface of the substrate,
the first portion of the collection member includes at least one protrusion disposed below the substrate and having a height that is less than a height of the substrate holding member protrusions.

11. The apparatus of claim 10, wherein the second portion is a hydrophilic member that attracts the immersion liquid from the first portion.

12. The apparatus of claim 11, further comprising a low-pressure passage communicating with the hydrophilic member to remove the immersion liquid from the hydrophilic member.

13. The apparatus of claim 12, wherein the second portion is tapered so that a distance between a plane containing the substrate and an upper surface of the second portion increases as the upper surface progresses radially away from the substrate holding member.

14. The apparatus of claim 11, wherein the second portion is tapered so that a distance between a plane containing the substrate and an upper surface of the second portion increases as the upper surface progresses radially away from the substrate holding member.

15. The apparatus of claim 14, wherein the collection member includes a third portion located radially outward of the second portion, the third portion is a porous member and receives the immersion liquid from the first and second portions, the porous member communicates with a low pressure source that draws the collected immersion liquid from the porous member.

16. The apparatus of claim 15, wherein at least a part of the first portion is tapered.

17. The apparatus of claim 10, wherein the second portion is a porous member and receives the immersion liquid from the first portion, the porous member communicates with a low pressure source that draws the collected immersion liquid from the porous member.

18. The apparatus of claim 17, wherein at least a part of the first portion is tapered so that a distance between a plane containing the substrate and an upper surface of the first portion increases as the upper surface progresses radially away from the substrate holding member.

19. The apparatus of claim 18, wherein the collection member includes a third portion located radially outward of the second portion, the third portion is a hydrophilic member so as to attract the immersion liquid from the first portion toward the second and third portions.

20. The apparatus of claim 17, wherein the collection member includes a third portion located radially outward of the second portion, the third portion is a hydrophilic member so as to attract the immersion liquid from the first portion toward the second and third portions.

21. A method of forming an image of a pattern onto a substrate, the method comprising:
holding the substrate on a substrate stage of a lithographic exposure apparatus with a substrate holding member of the substrate stage;
projecting the image through a projection optical system of the lithographic exposure apparatus and onto a surface of the substrate held by the substrate holding member while an immersion liquid is disposed in at least a part of a gap between a last optical element of the projection optical system and the surface of the substrate, the image being projected onto the surface of the substrate after passing through the immersion liquid; and
collecting immersion liquid that overflows the outer periphery of the substrate with an immersion liquid collection member disposed so as to be located at least partly below the outer periphery of the substrate held by the substrate holding member, the collection member having an uppermost liquid-receiving surface that is spaced below a lowermost surface of the substrate held by the substrate holding member,
wherein the collection member includes a first portion and a second portion, the first portion is located radially inward of the second portion so that the first portion is disposed closer to a center of the substrate holding member than is the second portion, a surface of the first portion is hydrophobic so as to repel the immersion liquid to assist in causing the immersion liquid to move from the first portion toward the second portion, at least a part of the hydrophobic surface of the first portion is disposed directly under the outer periphery of the substrate held by the substrate holding member, the second portion includes a hydrophilic surface, the hydrophobic surface and the hydrophilic surface are disposed so that the hydrophobic surface and at least a part of the hydrophilic surface of the second portion are parallel to the substrate held by the substrate holding member.

22. The method of claim 21, wherein the second portion is a hydrophilic member that attracts the immersion liquid from the first portion.

23. The method of claim 22, further comprising removing the immersion liquid from the hydrophilic member via a low-pressure passage that communicates with a low-pressure source.

24. The method of claim 23, wherein a part of the second portion is tapered so that a distance between a plane containing the substrate held by the substrate holding member and an upper surface of the second portion increases as the upper surface progresses radially away from the substrate holding member.

25. The method of claim 21, wherein a part of the second portion is tapered so that a distance between a plane containing the substrate held by the substrate holding member and an upper surface of the second portion increases as the upper surface progresses radially away from the substrate holding member.

26. The method of claim 21, wherein the second portion is a porous member and receives the immersion liquid from the first portion, the porous member communicates with a low pressure source that draws the collected immersion liquid from the porous member.

27. The method of claim 26, wherein at least part of the first portion is tapered so that a distance between a plane containing the substrate and an upper surface of the first portion increases as the upper surface progresses radially away from the substrate holding member.

28. The method of claim 27, wherein the collection member includes a third portion located radially outward of the second portion, the third portion is a hydrophilic member that attracts the immersion liquid from the first portion toward the second and third portions.

29. The method of claim 26, wherein the collection member includes a third portion located radially outward of the second portion, the third portion is a hydrophilic member that attracts the immersion liquid from the first portion toward the second and third portions.

30. The method of claim 21, wherein the substrate holding member includes a plurality of protrusions that contact a lower surface of the substrate, and further comprising:
inhibiting the immersion liquid from flowing along an under-surface of the substrate by disposing at least one protrusion on the first portion, the at least one protrusion being hydrophobic, being disposed below the substrate and having a height that is less than a height of the substrate holding member protrusions.

31. The method of claim 30, wherein the at least one alignment structure has a hydrophobic surface that repels the immersion liquid.

* * * * *